Jan. 14, 1964 B. CORNELISON 3,118,094

DIFFUSED JUNCTION TRANSISTOR

Filed Sept. 2, 1958

INVENTOR
Boyd Cornelison

BY Stevens, Davis, Miller & Mosher
ATTORNEYS

United States Patent Office 3,118,094
Patented Jan. 14, 1964

3,118,094

DIFFUSED JUNCTION TRANSISTOR

Boyd Cornelison, Dallas, Tex., assignor to Texas Instruments Incorporated, Dallas, Tex., a corporation of Delaware Filed Sept. 2, 1958, Ser. No. 758,422
5 Claims. (Cl. 317—235)

The present invention relates to a novel transistor configuration and more particularly to a new and improved transistor device and the method of making it by diffusion techniques.

In the manufacture of transistors, it is common to produce single crystals of a semiconductive material such as germanium and silicon, in a crystal pulling machine and to introduce impurities into the material during crystal growth. By carefully controlling the introduction of the impurity material, it is possible to determine the conductivity type of the growing crystal and by selectively adding another impurity material of opposite conductivity type to change the conductivity of predetermined regions of the body from either N or P to its opposite type. The general technique may be employed to produce a double-doped single crystal containing at least 2 PN junctions usually located in proximity to each other and preferably being separated by less than one mil. The frequency response of transistors made by the above-described technique is limited, and in order to achieve greater frequency response and adapt transistor devices to function in circuits at substantially higher frequencies, it has been necessary to develop new techniques.

Accordingly, the present invention has for its principal object to provide a novel transistor configuration which will be adapted to have a greater frequency response and be capable of operation at much higher frequencies than devices heretofore available. In addition the technique required to produce the novel transistor configuration is simple and can be carried out by conventional equipment with an expenditure of a minimum amount of time and effort. In fact the production of the transistor of the present invention can be accomplished far cheaper than transistor devices produced from grown crystals which have been double-doped.

In accordance with the present invention a semiconductive body that has been doped with an impurity of one conductivity type has formed therein a collector-base junction by means of vapor diffusion techniques. The emitter-base junction is formed by bonding to the diffused base layer, by welding, heating, etc., a fine wire, of the order of magnitude of one mil in diameter, having an impurity of a conductivity type opposite to that of the base region. The heating of the fine wire alloys the wire with the material of the base region and produces a rectifying junction. A fine wire is attached to the base region by welding to form a base contact; this lead having an impurity of the same type as the base region and therefore an ohmic contact is formed. As a result of the above method of fabrication, the resulting apparatus has an emitter-to-base junction with an exceptionally small cross-sectional area and in consequence the transistor has excellent operating characteristics at high frequencies.

It is, therefore, an object of the present invention to provide a novel transistor device which will operate more efficiently and effectively at higher frequencies than devices heretofore available.

It is an additional object of the present invention to provide a transistor device of novel structure which will be considerably cheaper to produce than transistor devices of the greater junction type.

It is another object of the present invention to provide a novel method of fabricating transistors.

It is yet another object of the present invention to provide a method of fabricating transistors having good high frequency response.

Other objects and advantages of the present invention will become more readily apparent from the following detailed description of a preferred embodiment of the present invention when taken in conjunction with the drawings.

Referring now to the invention in detail, a preferred embodiment is described in clear, concise, and exact terms as to enable a worker skilled in this art to practice this invention. For purposes of the ensuing discussion, it is considered that the transistor to be produced is of the PNP type. It will be appreciated, however, that the invention applies equally well to the manufacture of transistors of the NPN type. Again for purposes of illustrating the present invention, it is described with reference to germanium as the semiconductor material, but it will be appreciated that the invention is equally adapted to silicon as the semiconductor material, and would also be feasible with any other known semiconductor material.

The germanium semiconductor material selected was chosen from a single crystal of germanium having a resistivity of 2 ohm centimeters. The particular wafer selected was cut on the 1,1,1 plane. The wafer is of P type conductivity, this property having been imparted by the addition of a carefully calculated quantity of impurity to the molten charge of germanium in the crystal puller. In this regard it may be mentioned that the single crystal of germanium is obtained by a crystal pulling technique and that the crystal drawn or pulled is of single resistivity material. The technique differs from double-doping previously described in that the impurity content of the semi-conductor charge in the crystal puller is not altered during crystal growth.

Figure 1:
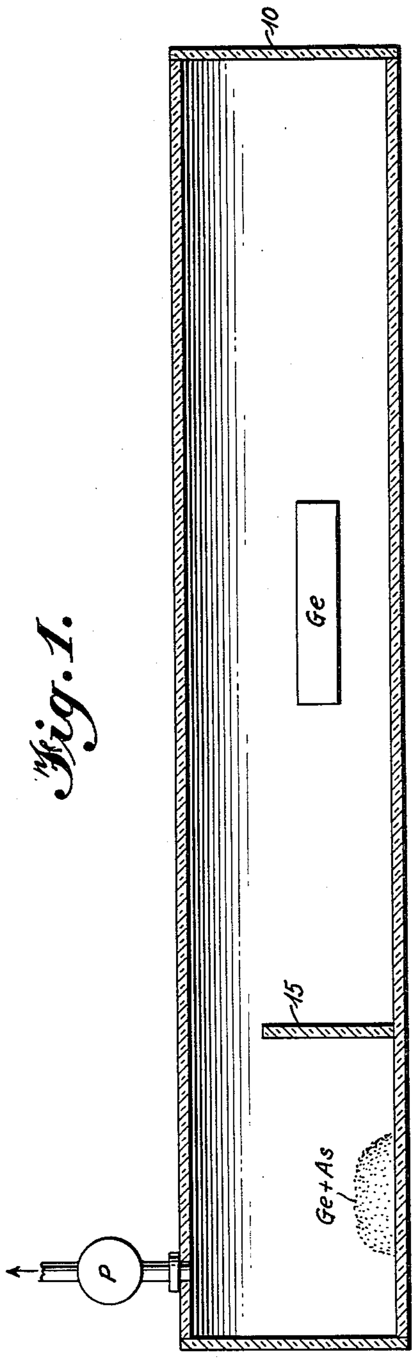
FIG. 1 illustrates the first step in the preparation of the device of the present invention and illustrates schematically the apparatus and manner of diffusing impurities into a semi-conductor crystal.
Figure 3:
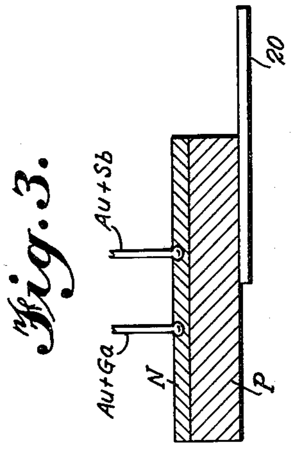
FIG. 3 illustrates the novel transistor configuration illustrating its structure schematically.
Figure 2:
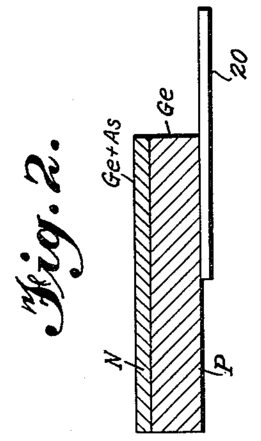
FIG. 2 illustrates schematically the device partially fabricated being provided with a collector attachment.

The wafer of germanium is enclosed in a suitable quartz tube 10 at one end thereof and a suitable quantity of germanium-arsenic alloy comprising approximately .5% arsenic and approximately 99.5% germanium is also placed within the quartz tube behind a baffle indicated in FIG. 1 by the numeral 15. The quartz tube is then evacuated to approximately 1 mm. of mercury, placed in a suitable furnace and heated to approximately 675% C. for approximately thirty hours. During this time the germanium arsenic alloy is vaporized and diffuses into the surface of the germanium wafer while in the gaseous state. The extent of the diffusion and the depth of penetration is determined by the concentration of the gaseous phase, the temperature, and the time. The mechanics of diffusion have been explored extensively and this technique has become a recognized procedure in the art.

At the conclusion of the diffusion operation, the wafer is removed from the quartz tube and the collector side of the wafer is lapped off or otherwise removed in order to eliminate the undesired diffused portion of the wafer on the collector side of the proposed device. A tab of material 20 compatible with the semiconductor material being worked is then soldered to the wafer on the collector side. It has been found that nickel is a compatible material with germanium and can be used as the material of the tab. The tab can then be spot welded to a header of any suitable design. The physical construction of the header is fairly well established in the art but in passing we might mention that it consists of a central raised portion circumferentially contiguous with an outer deformed ring having a U-shaped cross-section adapted to receive, in mating relationship, the edge of a can functioning to enclose or complete the encapsulation of the finished device when mounted upon the header. As is usual, three leads or wires approximately 10 to 20 mils in diameter project through the raised central portion of the header and are insulated from the header by means of glass beads. The material of the header may be Kovar or other recognized material for this use.

After attachment of the collector contact it is necessary to form the emitter junction and to attach the emitter and base leads. The collector-base junction comprises the interface between the region having the original doping material only and the region containing the diffused impurity; namely, arsenic in the specific example. The emitter-base junction is formed by bonding, spot welding, or alloying into the diffused surface (base region) of the wafer a gold wire consisting of approximately 98% gold and approximately 2% gallium. The wire chosen is approximately one mil in diameter and is bonded to or alloyed with the diffused surface of the wafer. Since the gold wire contains a P-type impurity, gallium, a PN junction is created which functions as the emitter-base junction. The gallium in the gold wire thus causes a rectifying junction to be formed in the N type diffused surface of the wafer and results in the final formation of a PNP structure.

The N-type diffused region of the wafer constitutes the base region and connection is made to this region using a doped gold wire consisting of approximately 99.3% gold and 0.7% antimony. The base connection is welded or bonded very close to the emitter connection about two or three mils away. Since the base lead consists of a heavily doped gold wire in which the wire is doped with antimony, an N-type impurity, an ohmic contact is made to the N-type diffused region of the wafer and results in an ohmic contact to the base layer of the device. The heat bonding process for both wires is identical and the difference in the result is determined wholly by the type of impurity employed.

The same device can be fabricated as an NPN type transistor by commencing with single crystal germanium of N-type conductivity and by diffusing into the surface thereof a P-type impurity. Thereafter, the connections to the transistor device are affected by the same type gold wires but in this case the gold wire heavily doped with antimony constitutes the emitter connection and forms the emitter-base junction when attached to the diffused surface of the wafer by being bonded to it. The gold wire doped with gallium becomes the base connection since it forms an ohmic contact with the P diffused region of the wafer.

Although the present invention has been shown and described in terms of a particular embodiment, it will be appreciated that various changes and modifications are conceivable which do not depart from the spirit, scope and contemplation of the present invention. Accordingly, such changes and modifications as are obvious to one skilled in the art are deemed to be within the scope of the invention.

What is claimed is:

1. A transistor comprising a body of semiconductive material containing impurities of a first conductivity type, a region of said body adjacent one of its surfaces having impurities of a second conductivity type diffused thereinto, first and second elements each having a diameter of the order of magnitude of about one mil and each being heat bonded to said region of said body, one of said elements containing about 98% gold and 2% gallium and the other of said elements containing about 99.3% gold to 0.7% antimony and a lead connected to a portion of said body apart from said region.

2. A transistor comprising a monocrystalline germanium wafer, a region of one conductivity-type defined by the major portion of said wafer, a thin diffused surface layer of the opposite conductivity-type defined in said wafer contiguous to said region, a pair of wires composed principally of gold having diameters of about one mil heat bonded at their ends to said surface layer at spaced positions, one of said wires containing a small amount of gallium and the other of said wires containing a small amount of antimony whereby emitter and base contacts will be provided, and a collector contact to said region.

3. A transistor comprising a germanium wafer, an N-type region defined by the major portion of said wafer, a diffused P-type surface layer defined in said wafer contiguous to said N-type region, a pair of elements each having a diameter of about one mil and each being fused to said surface layer at spaced positions, one of said elements being composed principally of gold with gallium as an impurity to form an emitter contact, the other of said contacts being composed principally of gold with antimony as an impurity to form a non-rectifying base contact, and a non-rectifying collector contact to said N-type region.

4. A semiconductor device comprising a body of single crystal semiconductive material, a region of one conductivity-type defined in said body, a diffused surface layer of the opposite conductivity-type defined in said body contiguous to said region, a pair of elements each having a cross-sectional area of about one mil and each being heat bonded to said diffused surface layer, said elements being composed of gold, one of said elements containing a donor impurity and the other of said elements containing an acceptor impurity, and a non-rectifying contact to said region.

5. A semiconductor device comprising a body of single crystal semiconductive material, a region of one conductivity-type defined in said body, a diffused surface layer of the opposite coductivity-type defined in said body contiguous to said region, a gold member having a diameter of about one mil and being heat bonded to said surface layer, said gold member containing a small amount of impurity material of said one conductivity-type whereby a rectifying contact is formed with said surface layer.

References Cited in the file of this patent

UNITED STATES PATENTS

| | | |
|---|---|---|
| 2,740,076 | Mathews et al. | Mar. 27, 1956 |
| 2,795,744 | Kircher | June 11, 1957 |
| 2,817,798 | Jenny | Dec. 24, 1957 |
| 2,821,493 | Carman | Jan. 28, 1958 |
| 2,833,969 | Christian | May 6, 1958 |
| 2,856,320 | Swanson | Oct. 14, 1958 |
| 2,861,018 | Fuller et al. | Nov. 18, 1958 |
| 2,889,499 | Rutz | June 2, 1959 |
| 2,916,408 | Freedman | Dec. 8, 1959 |
| 2,934,588 | Ronci | Apr. 26, 1960 |